United States Patent
Samson et al.

(10) Patent No.: US 11,152,324 B2
(45) Date of Patent: Oct. 19, 2021

(54) METHOD AND APPARATUS FOR MAKING INTEGRATED CIRCUIT PACKAGES

(71) Applicant: Texas Instruments Incorporated, Dallas, TX (US)

(72) Inventors: Roxanna Bauzon Samson, Benguet (PH); Ruby Ann Maya Merto, Baguio (PH); Lorraine Rivera Duldulao, San Fernando Pampanga (PH); Jason Binay-an Colte, Benguet (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 511 days.

(21) Appl. No.: 15/723,724

(22) Filed: Oct. 3, 2017

(65) Prior Publication Data

US 2018/0033758 A1    Feb. 1, 2018

Related U.S. Application Data

(63) Continuation of application No. 14/660,703, filed on Mar. 17, 2015, now abandoned.

(51) Int. Cl.
*H01L 23/49* (2006.01)
*H01L 23/00* (2006.01)
*H01L 23/495* (2006.01)
*H01L 21/48* (2006.01)

(52) U.S. Cl.
CPC .......... *H01L 24/27* (2013.01); *H01L 21/4839* (2013.01); *H01L 23/49524* (2013.01); *H01L 23/49537* (2013.01); *H01L 23/49562* (2013.01); *H01L 23/49575* (2013.01); *H01L 24/38* (2013.01); *H01L 24/40* (2013.01); *H01L 24/41* (2013.01); *H01L 24/83* (2013.01); *H01L 24/97* (2013.01); *H01L 2224/2741* (2013.01); *H01L 2224/32245* (2013.01); *H01L 2224/40245* (2013.01); *H01L 2224/48137* (2013.01); *H01L 2224/48247* (2013.01); *H01L 2224/83815* (2013.01); *H01L 2224/97* (2013.01); *H01L 2924/00014* (2013.01); *H01L 2924/00015* (2013.01); *H01L 2924/14* (2013.01); *H01L 2924/181* (2013.01)

(58) Field of Classification Search
CPC ......... H01L 24/27; H01L 24/40; H01L 24/38; H01L 24/41; H01L 23/49524; H01L 23/49537; H01L 23/49562; H01L 23/49575; H01L 21/4839; H01L 24/97; H01L 24/83; H01L 24/84
See application file for complete search history.

(56) References Cited

U.S. PATENT DOCUMENTS

| | | |
|---|---|---|
| 4,893,403 A | 1/1990 | Heflinger et al. |
| 5,370,301 A | 12/1994 | Belcher et al. |
| 5,702,224 A | 12/1997 | Kubota |

(Continued)

*Primary Examiner* — Charles D Garber
*Assistant Examiner* — S M Sohel Imtiaz
(74) *Attorney, Agent, or Firm* — Dawn Jos; Charles A. Brill; Frank D. Cimino

(57) ABSTRACT

A method of making a plurality of integrated circuit ("IC") packages includes picking up a plurality of physically unconnected IC components; and simultaneously placing each of the physically unconnected IC components on corresponding portions of an unsingulated IC package strip that includes a sheet of integrally connected leadframes.

18 Claims, 11 Drawing Sheets

(56) References Cited

U.S. PATENT DOCUMENTS

| | | | |
|---|---|---|---|
| 6,438,830 B1 | 8/2002 | Dibble et al. | |
| 6,505,665 B1 | 1/2003 | Ulmer et al. | |
| 7,579,215 B2 | 8/2009 | Swirbel | |
| 2006/0164466 A1* | 7/2006 | Mizuno | B41J 2/14233 347/58 |
| 2008/0096319 A1* | 4/2008 | Hwa | H01L 23/49562 438/112 |
| 2009/0206458 A1* | 8/2009 | Andrews, Jr. | H01L 25/105 257/676 |
| 2009/0212405 A1* | 8/2009 | Liu | H01L 24/97 257/670 |
| 2010/0148327 A1* | 6/2010 | Madrid | H01L 24/84 257/670 |
| 2012/0001306 A1* | 1/2012 | Wang | H01L 23/49503 257/666 |
| 2013/0082407 A1* | 4/2013 | Abbott | H01L 23/36 257/787 |
| 2013/0256852 A1* | 10/2013 | Wyant | H01L 24/84 257/670 |
| 2014/0087520 A1* | 3/2014 | Funatsu | H01L 24/83 438/112 |
| 2014/0110828 A1* | 4/2014 | Otremba | H01L 23/49524 257/675 |
| 2014/0197534 A1* | 7/2014 | Partosa | H01L 23/49811 257/737 |
| 2014/0248746 A1* | 9/2014 | Partosa | H01L 23/49811 438/125 |
| 2016/0225704 A1* | 8/2016 | Cao | H01L 21/4825 |

* cited by examiner

METHOD AND APPARATUS FOR MAKING INTEGRATED CIRCUIT PACKAGES

This application is a continuation of application Ser. No. 14/660,703, filed Mar. 17, 2015 which is hereby incorporated by reference for all that it discloses.

BACKGROUND

There are many types of integrated circuit ("IC") packages. Most IC packages include at least one leadframe and at least one die electrically connected to the leadframe, as by bond wires or clips. The electrical components of most IC packages are protected by an encapsulation layer of mold compound. Some IC packages, for example, Quad Flat No-Lead Packages ("QFNs"), include a leadframe with multiple dies that are electrically connected to the leadframe with multiple clips.

Usually, the production of IC packages involves mounting of IC components on each of a number of integrally connected leadframes on a leadframe strip. Typically each IC package component is mounted, one at a time, on each of the different leadframes. At the end of the component mounting and electrical connection processes the components mounted on each of the leadframes of the leadframe strip are encapsulated with mold compound that hardens into a protective coating. The encapsulated strip is then singulated (cut or diced) so as to separate the interconnected leadframes and the associated components mounted on each leadframe into separate IC packages.

DETAILED DESCRIPTION

Figure 1:
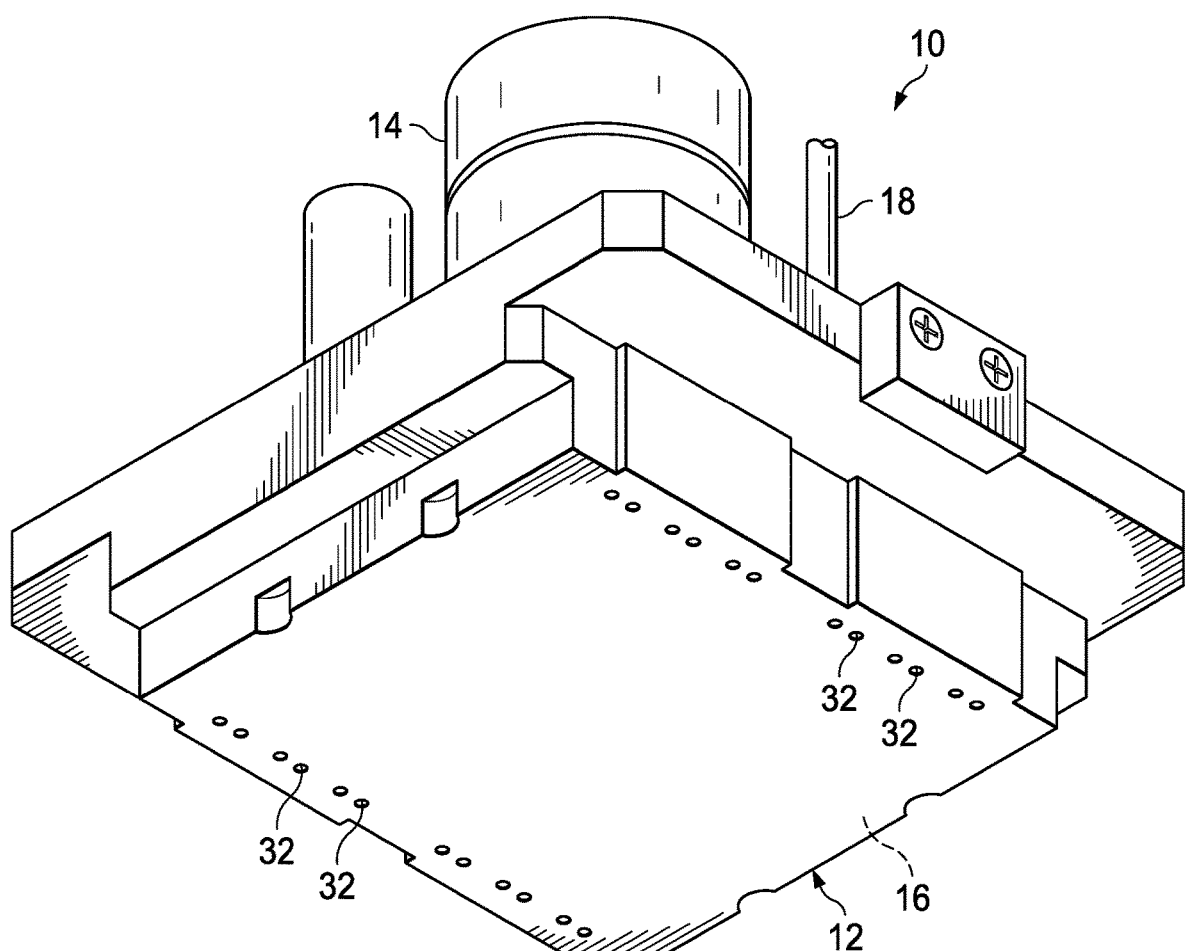
FIG. 1 is an isometric view of a pick and place machine.

A pick and place machine is used to pick up an object(s), move the object(s) to a desired location, and then release the object. FIG. 1 is an isometric view of a prior art pick and place machine 10 used in making IC packages. The pick and place machine 10 has a tool head 12 and a conventional displacement assembly 14 that is adapted to selectively move the head 12 between operating positions. An air manifold 16 is located within the tool head 12. The air manifold 16 is connected by a conduit 18 to a conventional, selectively variable vacuum source (not shown).

Figure 2:
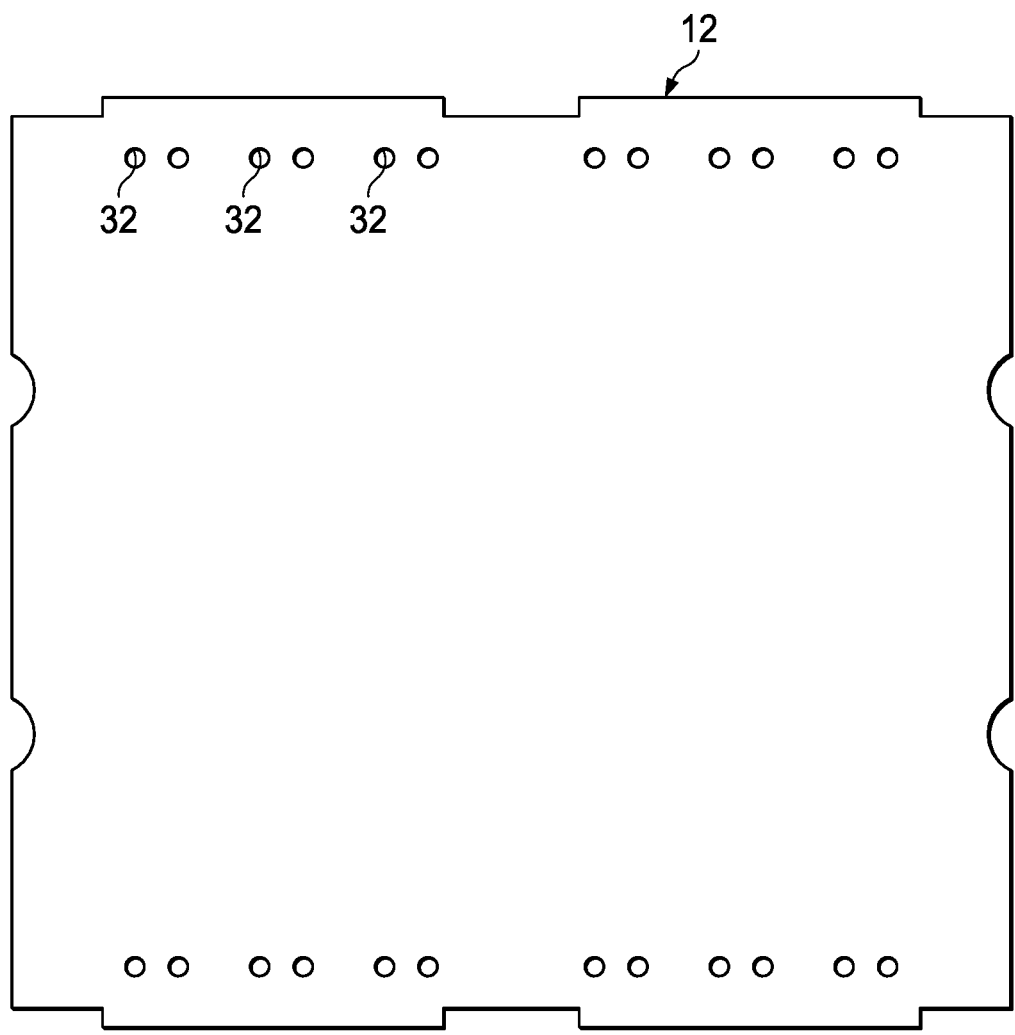
FIG. 2 is a bottom plan view of a bottom face of a tool head of a pick and place machine.

FIG. 2 is a bottom plan view of the prior art tool head 12 for the pick and place machine 10 that is shown in FIG. 1. The tool head 12 has a plurality of holes 32 extending therethrough, which are located in linear alignment near opposite edges of the tool head 12.

Figure 3:
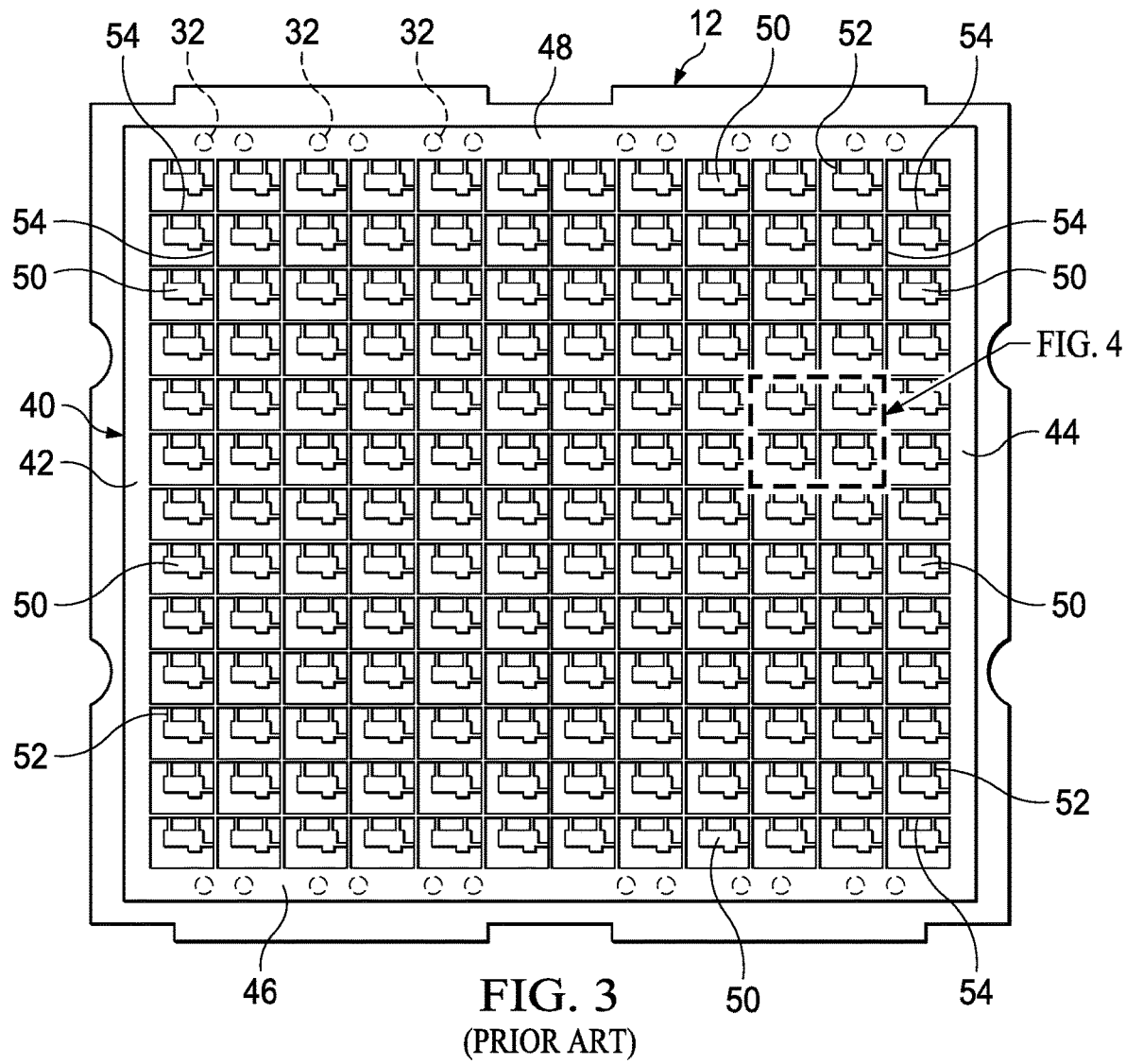
FIG. 3 is a bottom plan view of a gang clip frame assembly supported on the tool head of FIG. 2.

FIG. 3 is a schematic bottom plan view of a prior art gang clip frame 40 supported by the tool head 12 of FIG. 2. The gang clip frame 40 has parallel, opposite frame members 42 and 44 and parallel opposite frame members 46 and 48, which extend perpendicular to members 42 and 44. In operation, frame members 46 and 48 are placed in alignment with the two lines of holes 32 at the edges of the plate 40. Vacuum force (suction) is applied through the holes 32 to hold the clip frame 40 against the surface of the tool head 12. The support frame 40 supports a plurality of QFN clips 50 positioned inside it. Tie rails 54 form a rectangular grid with a plurality of rectangular openings. A clip 50 is positioned within each of the rectangular openings and is held at a fixed position in the opening by tie bars 52 that connect the clip 50 to tie rails 54. A more detailed view of the clips 50, tie bars 52 and tie bars 54 is shown, in a four unit portion 41 of the gang clip frame 40, in FIG. 4.

Figure 4:
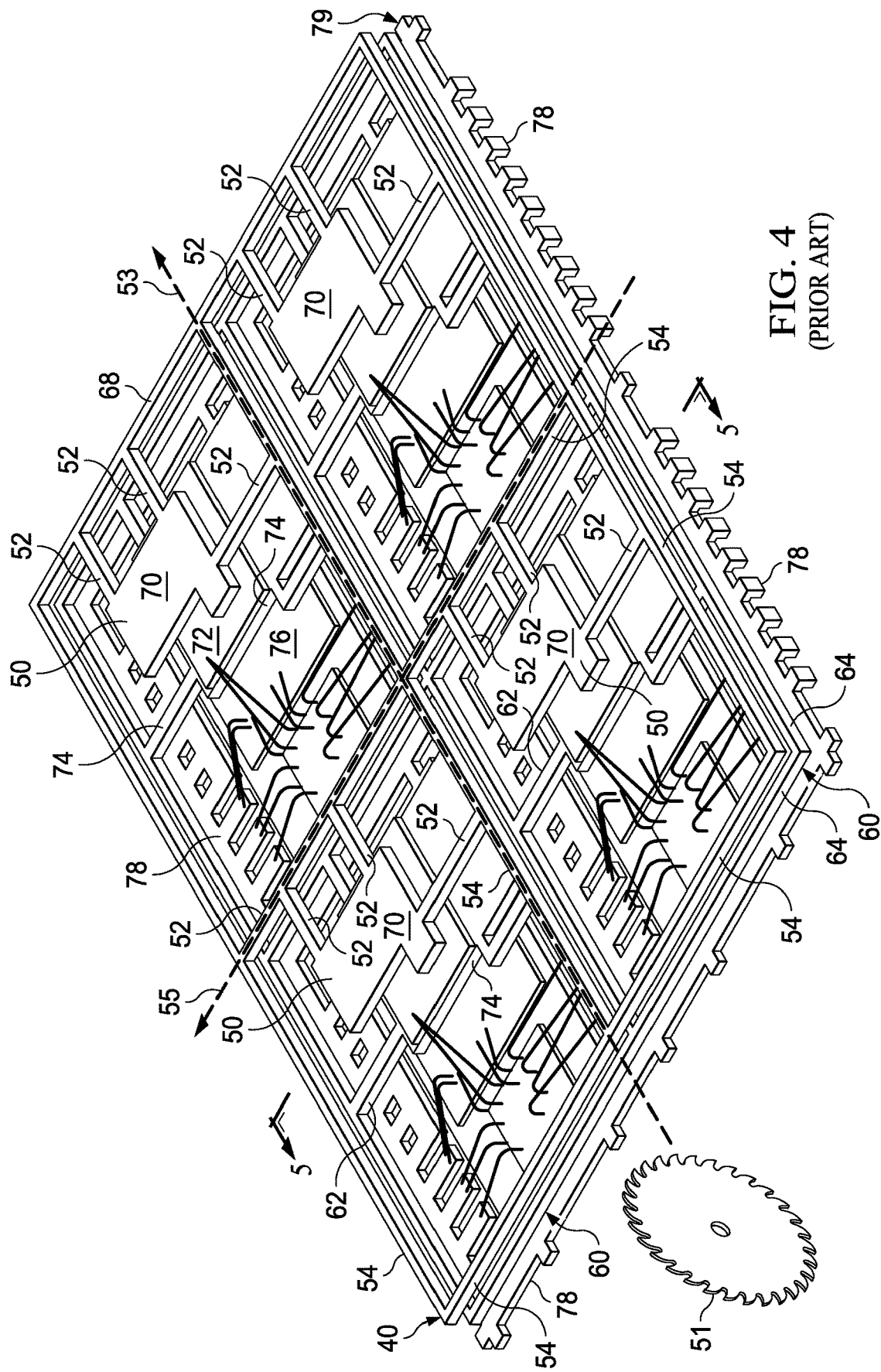
FIG. 4 is a top isometric view illustrating an assembly formed in one stage in the production of quad flat no-lead packages ("QFNs").

FIG. 4 is a top isometric view illustrating an intermediate product assembly formed in one stage in the production of quad flat no-lead packages ("QFNs"). FIG. 4 illustrates an internal, four rectangular grid portion of the gang clip frame 40 shown in FIG. 3. This portion of the gang clip frame 40 of FIG. 3 is labeled "40" in FIG. 4, even though it is only a four unit portion of the gang clip frame 40 of FIG. 3. In FIG. 4, the gang clip frame portion 40 is positioned at the top of a plurality of component stacks 70, which are, in turn, positioned above individual lead frames 78. The leadframes 78 are arranged in an interconnected grid on a continuous lead frame sheet 79. The grid of leadframes 78 on leadframe sheet 79 corresponds in size and shape to the grid of the clip frame 40. Two of the four component stacks 70 shown in FIG. 4 are shown in cross section in FIG. 5.

Figure 5:
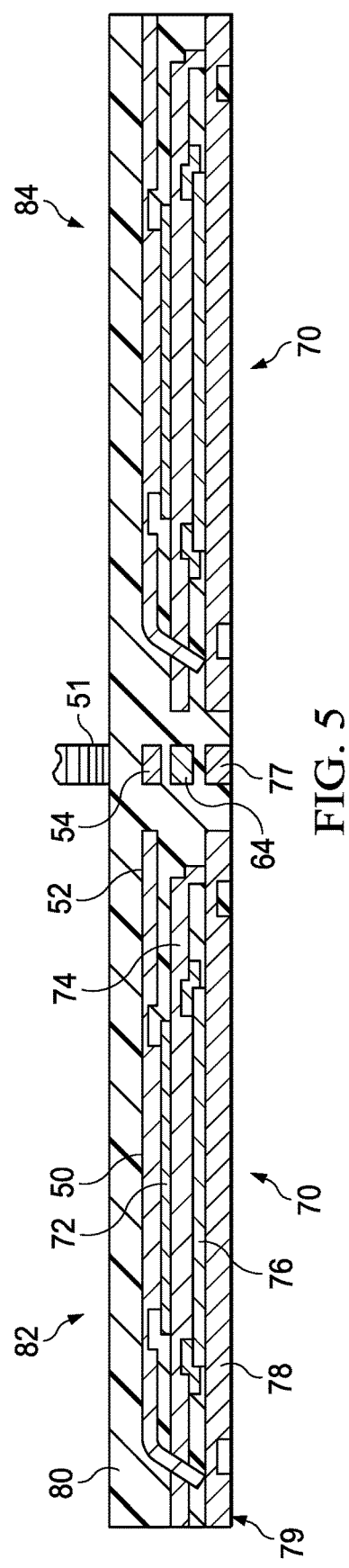
FIG. 5 is a cross-sectional elevation view of the assembly of FIG. 4 after molding and just prior to singulation thereof.

In the intermediate product assembly of FIGS. 4 and 5, the gang clip frame assembly 40 is positioned directly on top of a lower gang clip frame assembly 60. The lower gang clip frame assembly 60 has a structure similar to the upper gang clip frame assembly 40 and is used to support lower clips 61. Lower clips 61 are attached to tie bars 62 that are connected to tie rails 64. The lower clips 61 are each supported within a rectangular opening formed by associated tie rails 64.

Figure 6:
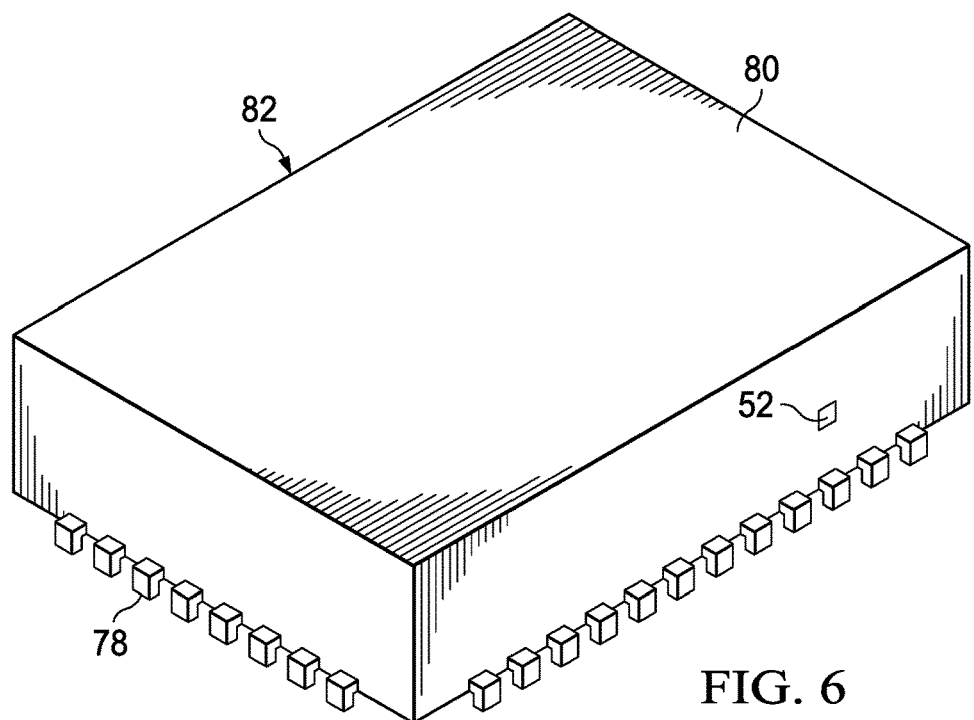
FIG. 6 is an isometric view of a prior art QFN.

The various components of each component stack 70 are best illustrated in FIG. 5. FIG. 5 is a cross-sectional elevation view of the assembly of FIG. 4, after that assembly has been heated in a reflow oven to bond the various components of each stack 70 and then encapsulated in mold compound 80, as by use of a conventional transfer mold (not shown). The leadframe sheet 79 and the various components mounted thereon are, in FIG. 5, about to be singulated with a singulation saw 51 along saw streets 53, 55, which are shown for illustrative purposes in FIG. 4. Each QFN component stack 70 of the illustrated embodiment, prior to placement of the top gang clip frame 40, includes a top die 72, a lower clip 74 and a bottom die 76. These components are all stacked on a corresponding lead frame 78 of the lead frame strip 79. A top clip 50 is the top component of each component stack 70. The various components of each stack are typically held in place during stack formation by a thin layer of solder paste or adhesive. The solder paste or adhesive is heated for an appropriate time with an appropriate heat source, e.g. a reflow furnace, after the stacks 70 are assembled to bond the various components 50, 72, 76 and leadframe 78. Singulation of the assembly shown in FIGS. 4 and 5 takes place after stack assembly, bonding and molding. Singulation separates the assembly of FIGS. 4 and 5 into a plurality of QFNs 82, 84, etc. FIG. 6 is an isometric view of one such singulated QFN 82. Singulation removes vertically aligned tie rails 54 and 64 of the gang clip frame assemblies 40 and 60 and leadframe connecting structure 77 of the leadframe strip 79.

Figure 7:
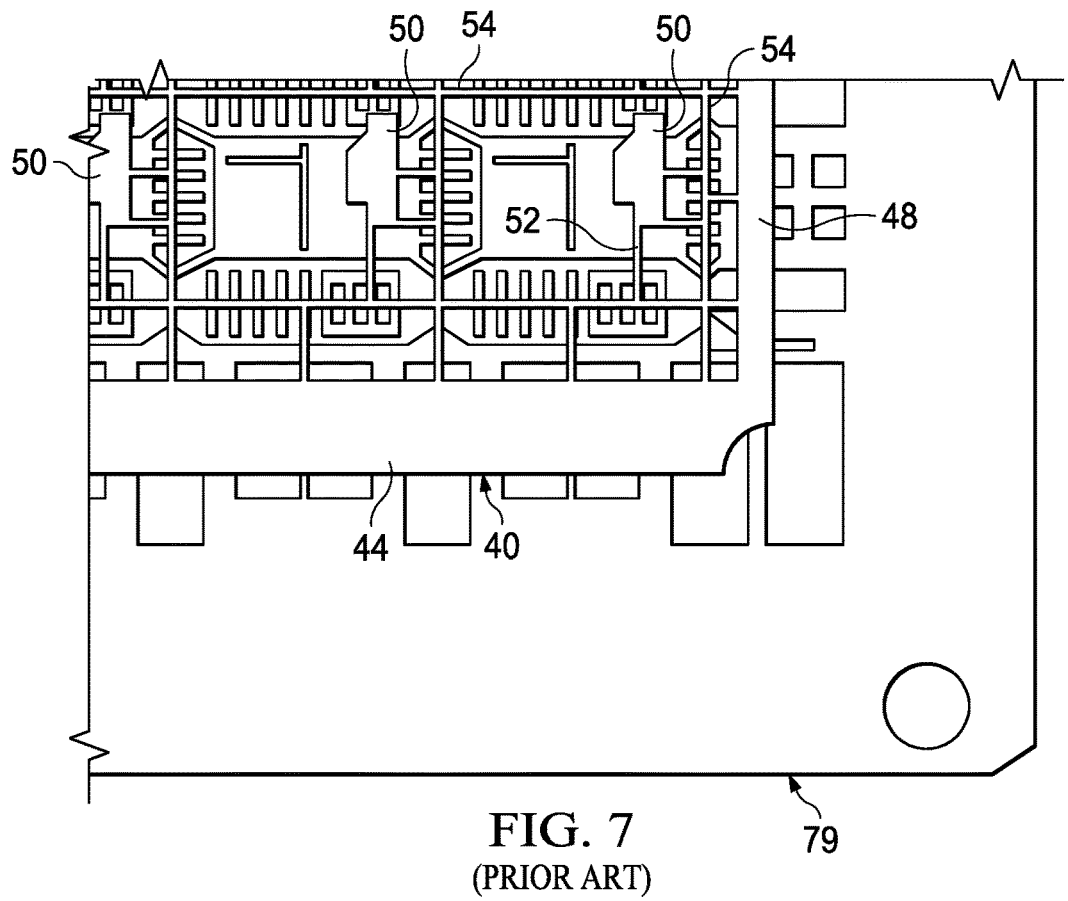
FIG. 7 is a detail top plan view of a portion of a prior art gang clip frame assembly, which is schematically illustrated in FIG. 3, mounted over a QFN intermediate product assembly, such as shown in FIG. 4, prior to molding.

FIG. 7 is a detail top plan view of a portion of the gang clip frame assembly 40, such as shown in FIG. 3, mounted over a QFN intermediate product assembly, such as shown in FIG. 4. The clip frame assembly 40 has four outer frame members 44, 48, etc. (only two shown in FIG. 7). The tie bars 52 and tie rails 54 support the clips 50 within the frame assembly 40. The outer frame members 44, 48, etc., tie bars 52, and tie rails 54 create a number of problems during the QFN production process as will now be described.

The gang clip frame assembly 40 often causes mold flashing during the molding stage of the production process. Such mold flashing affects the components of the component stacks 70 located at an edge of the clip frame 40 member, e.g. 46, that is adjacent to the mold gate. During molding, the mold compound flow at this edge of the leadframe 40 is a high pressure, turbulent flow. This mold compound flow can cause some the components in the row positioned closest to this frame edge to be displaced. Such displacement may result in irregular package shapes and may also cause electrical failures.

Another problem is package chipping in which chips of the mold compound break off during singulation. Package chipping occurs primarily because of the relatively small distance between the top of the mold compound 80 and the tie bars 54 of the gang clip frame assembly 40, as best shown in FIG. 5. The small thickness of the mold compound 80 above the tie bars 54 is inherently unstable and tends to crack and break off during the stress exerted by the saw blade 51 during singulation.

Exposed metal is another problem associated with the use of gang clip frame assemblies 40. The assemblies sometimes become misaligned with the rest of a stack assembly 70, FIGS. 4 and 5, during initial stack formation or movement to a reflow oven or during the heating cycle itself. Tie bars and tie rails are ordinarily removed by singulation, but, if a gang clip frame assembly 40 is misaligned, singulation may not remove some portion of the tie bars or tie rails and that portion is then exposed at the surface of the mold compound 80.

Clip warpage and misalignment and associated damage to electrical connection of clips to associated components may occur because of non-uniform expansion and contraction of the tie bars 54 during reflow heating.

A new method of gang mounting clips on QFN intermediate product assemblies, which reduces or eliminates some or all of the above explained problems will now be described.

Figure 8:
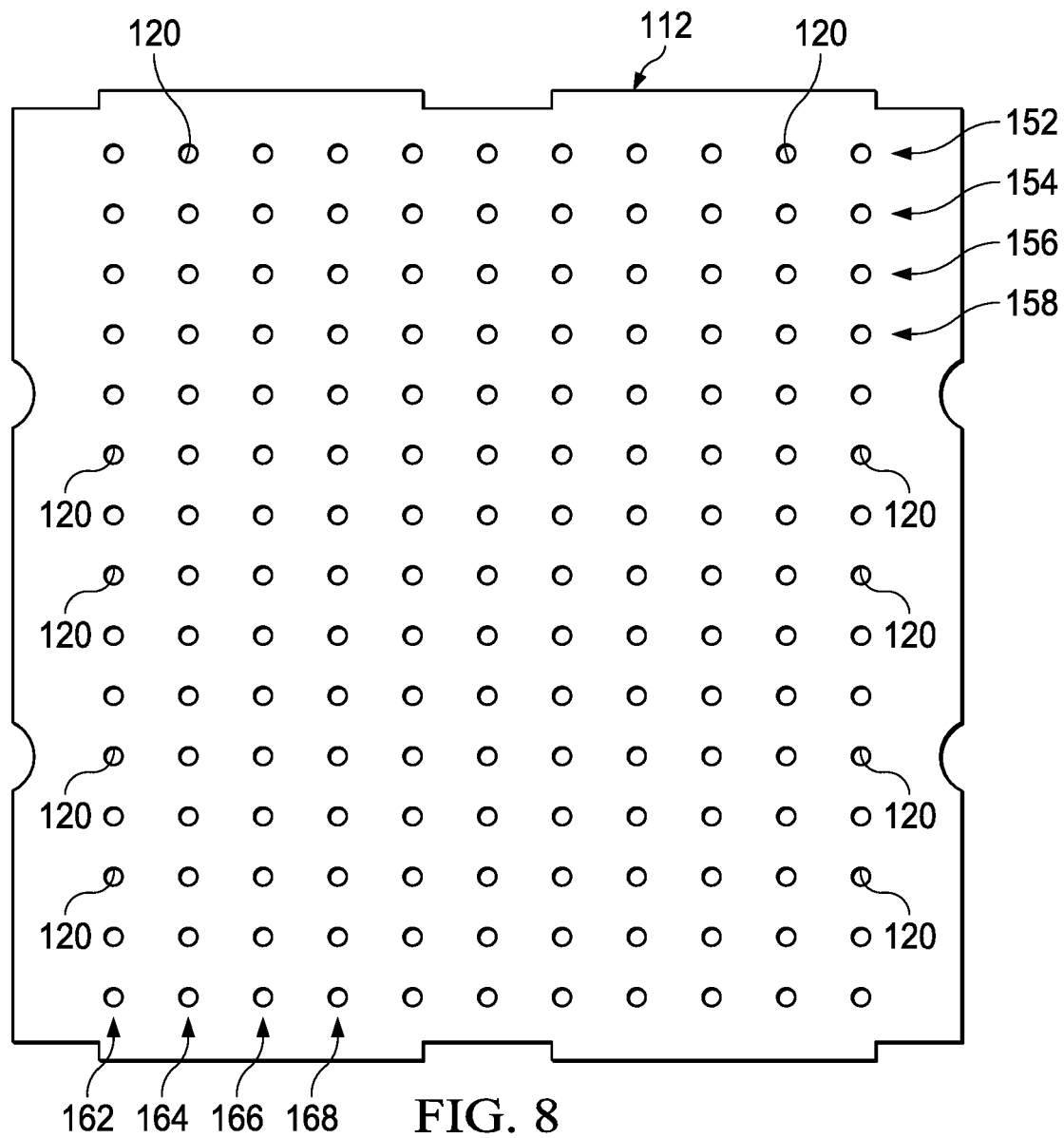
FIG. 8 is a bottom plan view of an example embodiment of a new pick and place tool head.

An example embodiment of a new pick and place tool head 112 is illustrated in FIG. 8. In this embodiment the tool head 112 includes a plate having a plurality of evenly spaced holes 120 therein, which are arranged in a rectangular grid comprising a plurality of rows 152, 154, 156, 158, etc.; and a plurality of columns 162, 164, 166, 168, etc.

Figure 9:
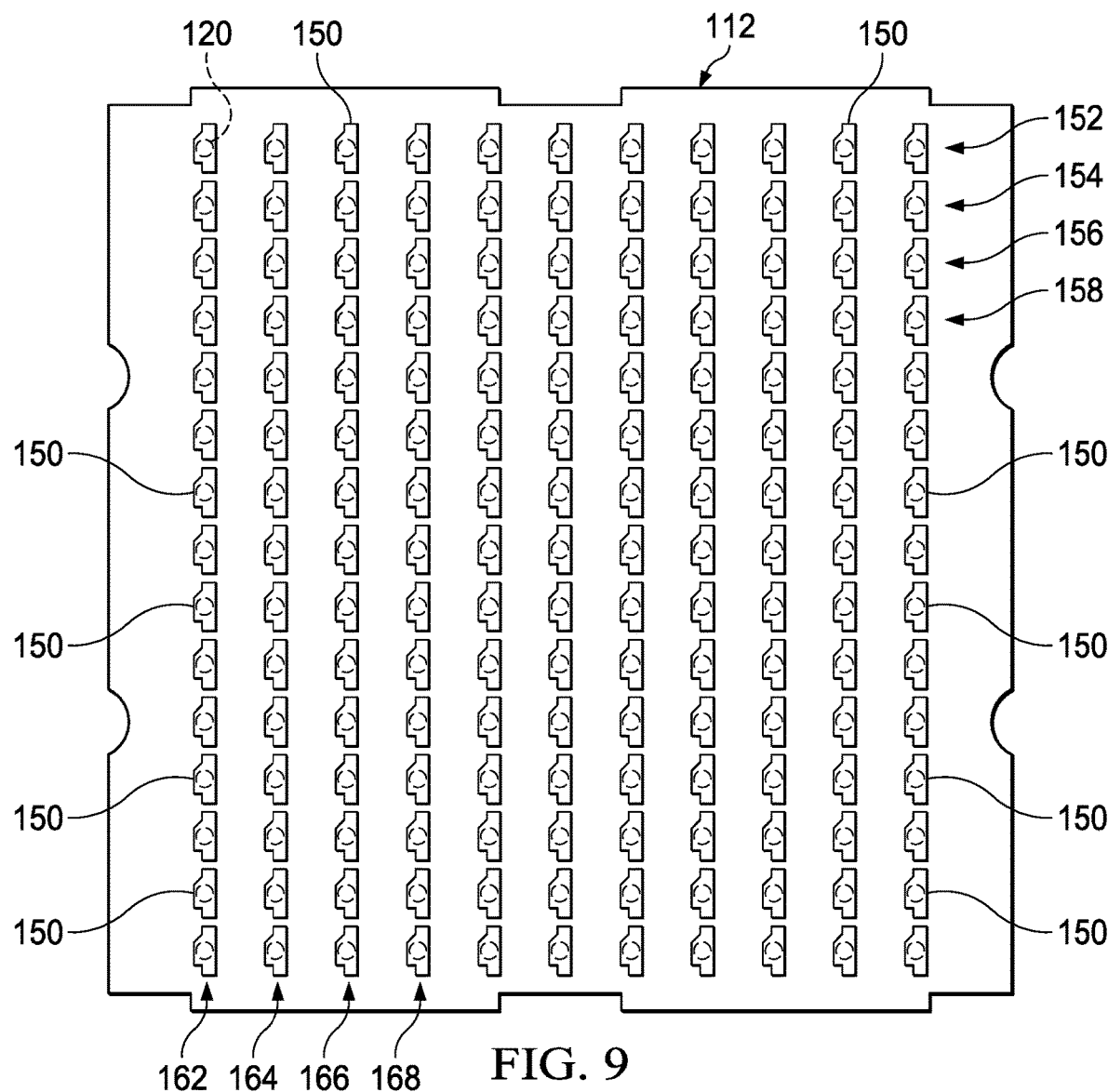
FIG. 9 is a bottom plan view illustrating the pick and place tool head of FIG. 8 supporting a plurality of singulated clips.

FIG. 9 is a bottom plan view illustrating the pick and place tool head 112 of FIG. 8 supporting a plurality of singulated clips 150. In one embodiment, the singulated clips 150 are removed from a clip frame, such as clip frame assembly 40 illustrated in FIG. 3. The singulation of the clips to form the singulated clips 150 leaves a mark on the clips, referred to as singulation mark. In other words, the singulation mark includes characteristics of the singulation process. For example, in a saw singulation, the singulation mark includes features of marks left by the saw. The individual clips 150, with no tie bars or other support structure, are then picked up by the tool head 112 by application of a vacuum to an associated air manifold behind the tool head 112. The construction of the pick and place machine upon which the tool head 112 is mounted may be the same as that previously described with reference to FIG. 1. In one embodiment, after singulation, the clips 150 are placed on a support substrate such as a tray or tape (not shown) where they are arranged in a pattern and orientation corresponding to that of the grid of IC package assemblies on which they are to be mounted. This pattern also corresponds to that of the hole grid of the tool head 112. A registration structure, such as indents or raised ribs (not shown), may be provided on the face of the tool head 112 to help hold each clip 150 in a predetermined position and orientation.

Figure 11:
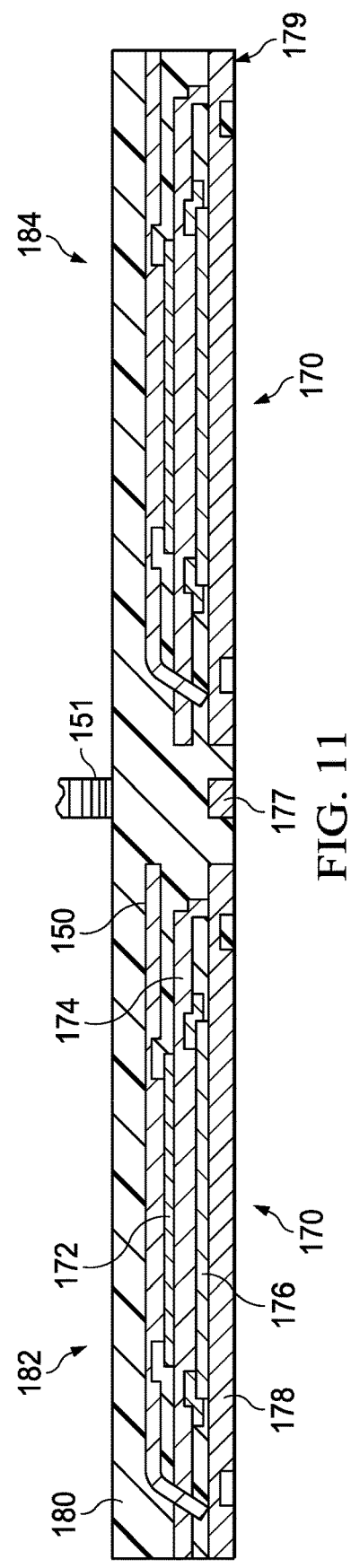
FIG. 11 is a cross-sectional elevation view of the assembly of FIG. 10 after molding and just prior to singulation.
Figure 10:
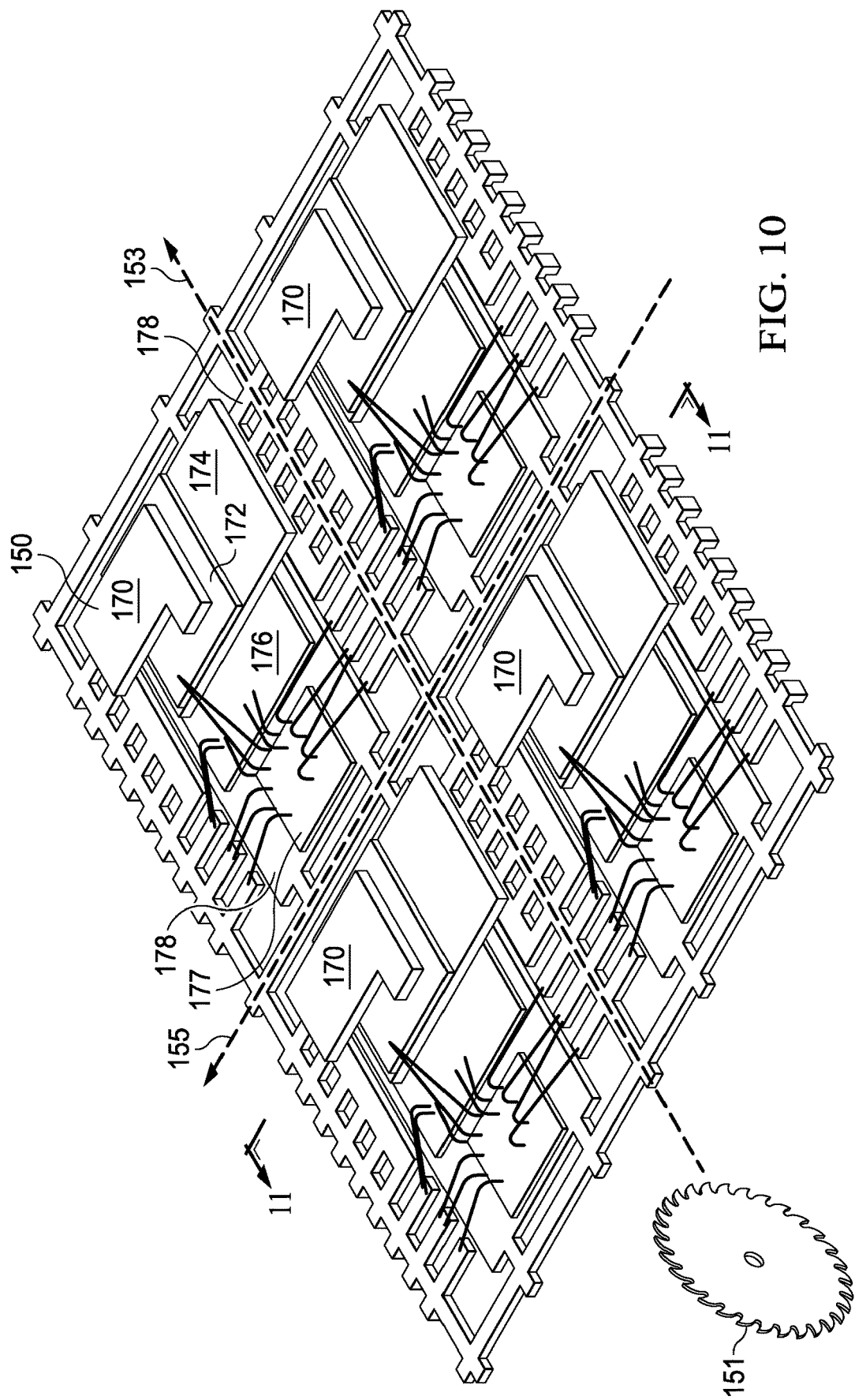
FIG. 10 is a top isometric view illustrating an assembly formed in one stage in the production of quad flat no-lead packages ("QFNs").
Figure 12:
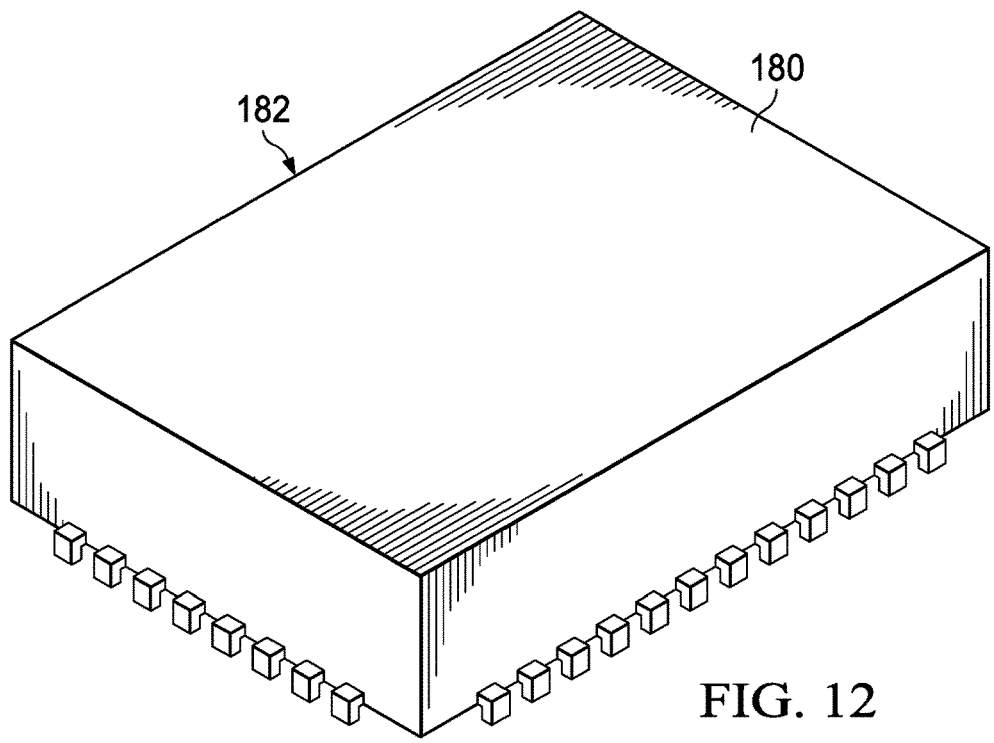
FIG. 12 is an isometric view of a QFN produced by singulating the assembly of FIGS. 10 and 11.

FIG. 10 is a top isometric view illustrating an assembly formed in one stage in the production of quad flat no-lead packages, e.g. 182, FIG. 12. In the assembly of FIG. 10, the clips 150 have been singulated prior to being picked up by a multiple clip pick up head, such as head 112, and placed on component stacks 170, providing the top component of the stack 170. Each component stack 170, as shown in FIGS. 10 and 11, is mounted on a leadframe 178 of a leadframe strip 179. The components of each stack 170 include a lower die 176 mounted on the leadframe 178, a lower clip 174 mounted on the lower die 176, an upper die 172 mounted on the lower clip 174, and an upper clip 150 mounted on the upper die 172. In the embodiment shown in FIG. 10 a second lower die 171 is also mounted on the leadframe 178. During stack formation, prior to adding each component to a stack 170, a layer of solder paste or adhesive is provided between components to be bonded. After stack formation, the stacks they are heated by an appropriate heat source to bond the various components in the stack.

In FIG. 10, wire bonding and stack assembly and bonding of stack components have already taken place. After bonding, molding takes place, as shown in FIG. 11. FIG. 11 is a cross-sectional elevation view of the assembly of FIG. 10 after molding. During molding a layer of mold compound 180 is applied, which covers the various components of each stack 170. The assembly of FIG. 11 may be singulated by a conventional singulation saw 151 along saw streets 155, 153, etc., which are shown in FIG. 10 for illustrative purposes. One difference between the assembly of FIGS. 10 and 11 and the assembly of FIGS. 4 and 5 is that tie bars 52, tie rails 54 and frame members 42, 44, 46, 48 do not exist in the intermediate product assemblies illustrated in FIGS. 10 and 11.

A QFN 182 made by the process described above with reference to FIGS. 8 through 11 is illustrated in FIG. 12. This QFN 182 has the QFN stack components, which are illustrated in FIGS. 10 and 11, encased in a layer of mold compound 180. There is a difference between the QFN 182 made from the assemblies shown in FIGS. 10 and 11 and the previously described QFN 82 made through use of a gang clip frame assembly 40. The QFN 82 has tie bars 52 attached to a clip 50 positioned inside it that are exposed on face surfaces of the QFN 82. The QFN 182 has no tie bars attached to its internal clip 150 or exposed at the package faces. Also, as a result of the difference in the two production processes QFNs 182 made without use of a gang clip frame assembly 40 are not subject to the problems of flashing, chipping, exposed metal, clip warping and misalignment described above.

Figure 14:
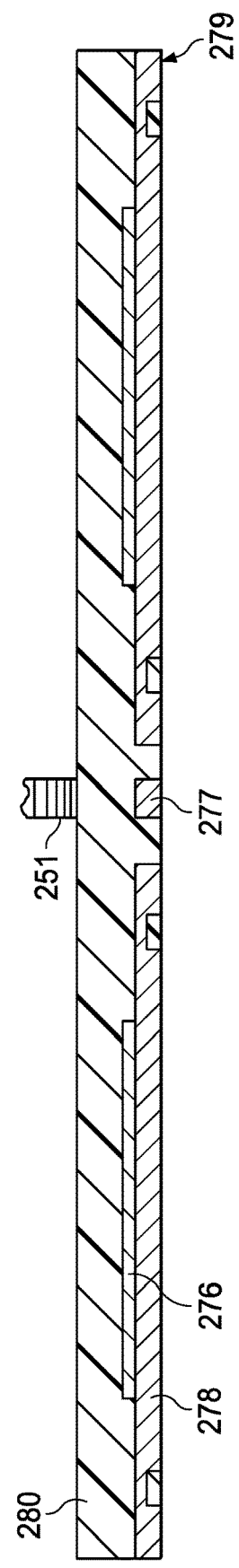
FIG. 14 is a cross-sectional view illustrating a plurality of integrated circuit dies that have been gang mounted, without a frame, on corresponding leadframes of a leadframe strip, after encapsulation and just prior to singulation.

A method similar to the method of gang mounting clips 150 on associated QFN stacks 170 described with reference to FIGS. 8-11, may be used for gang mounting of dies, e.g., dies 172 and/or dies 176 shown in FIG. 11, on an associated component stack 170 of an integrated circuit package. This method of mounting dies may be identical to that described above with reference to FIGS. 8-11, except that a plurality of dies 250, FIG. 14, rather than a plurality of clips 150, are picked up and placed by a multiple hole head 212 on an array of partially assembled package components. In one embodiment, as shown in FIG. 14, the dies 250, after singulation from a wafer, are gang mounted on the die attachment pads of a plurality of leadframes 278 on a leadframe strip 279. This method of gang die mounting can be used alone or in combination with the above described method of frameless gang clip mounting. The above described methods may be used for manufacturing QFNs or for other types of integrated circuit packages.

Figure 15:
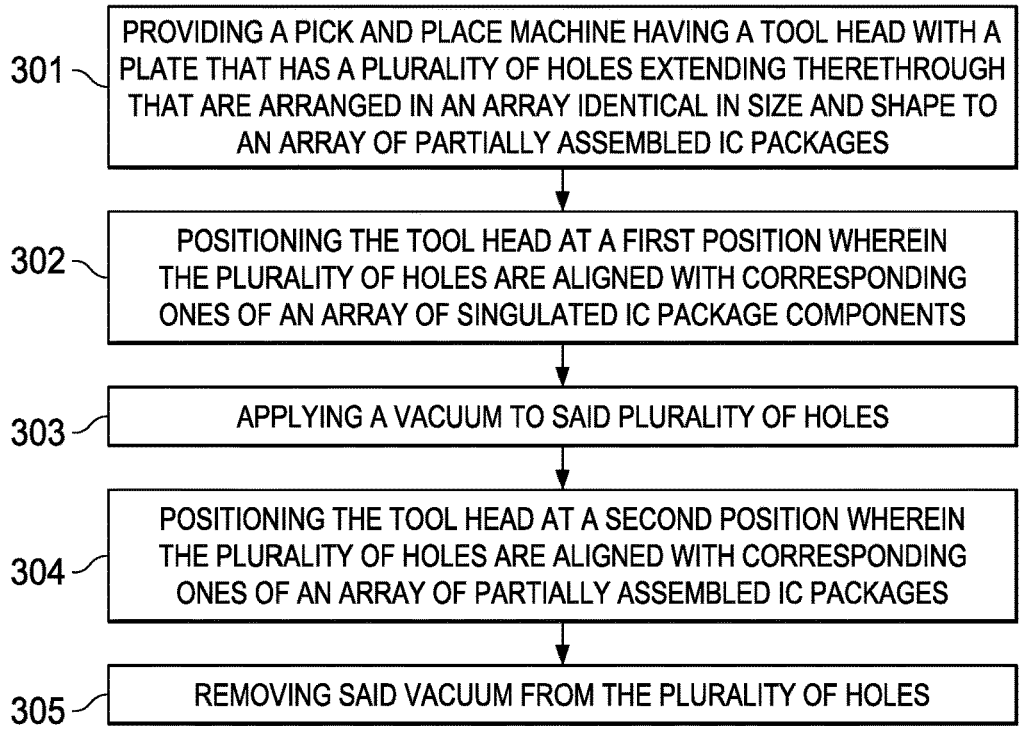
FIG. 15 is a block diagram of an example embodiment of a method of making QFNs.
Figure 13:
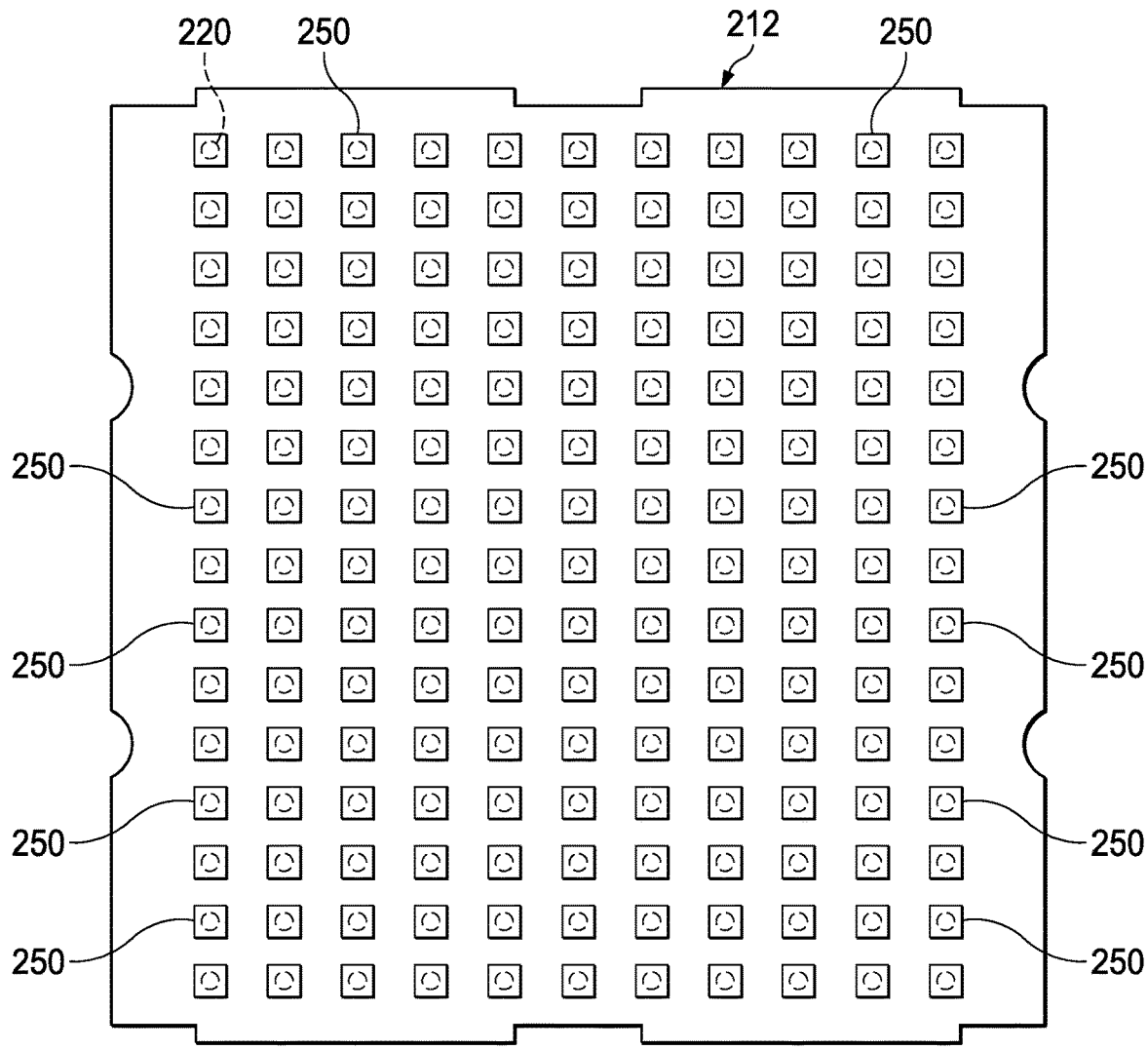
FIG. 13 is a bottom plan view illustrating a pick and place tool head such as illustrated in FIG. 8 supporting a plurality of singulated integrated circuit dies.

FIG. 15 is a flow diagram that illustrates one embodiment of a method of making integrated circuit ("IC") packages. The method includes, as shown at block 301, providing a pick and place machine having a tool head with a plate that has a plurality of holes extending therethrough that are arranged in an array identical in size and shape to an array of partially assembled IC packages. The method further includes, as shown at block 302, positioning said tool head at a first position wherein said plurality of holes are aligned with corresponding ones of an array of singulated IC package components and, as shown at block 303, applying a vacuum to said plurality of holes. The method also includes, as shown at block 304, positioning the tool head at a second position wherein said plurality of holes are aligned with corresponding ones of the array of partially assembled IC packages; and, as shown at 305, removing said vacuum from said plurality of holes.

Figure 16:
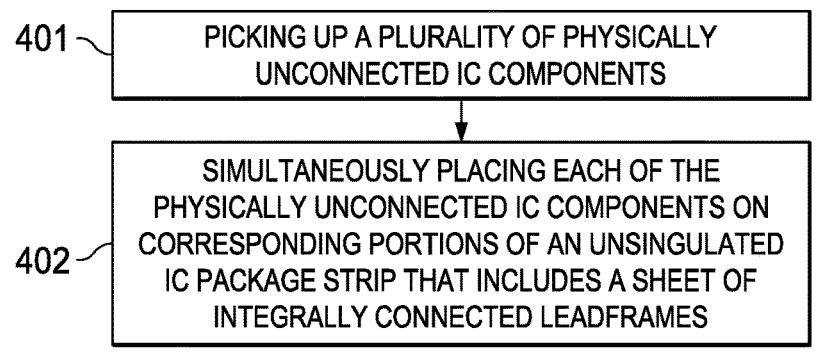
FIG. 16 is a block diagram of another example embodiment of a method of making QFNs.

FIG. 16 is a flow diagram that illustrates another embodiment of a method of making integrated circuit ("IC") packages. The method includes, as shown at block 401, picking up a plurality of physically unconnected IC components of a first type and, as shown at block 402 simultaneously placing each of the physically unconnected IC components of the first type on corresponding portions of an unsingulated IC package strip that includes a sheet of integrally connected leadframes.

The methods and structures described with reference to FIGS. 8-16 provide for frameless gang mounting of IC components to produce a plurality of IC packages. Because gang mounting is used, as opposed to one component at a time mounting, the efficiencies provided by these methods and structures FIGS. 8-16 are similar to those of the frame gang mounting methods and structures described with reference to FIGS. 1-6. However, since the gang mounting described with reference to FIGS. 8-16 is frameless, it may obviate some or all of the above described problems associated with frame gang mounting. These problems include the problems of flashing, package chipping, exposed metal, component warping and component misalignment.

Although certain embodiments of methods and apparatus for frameless gang mounting of components of an integrated circuit package have been described in detail above, it will occur to those skilled in the art, after reading this disclosure, that the expressly disclosed embodiments may be otherwise embodied. It is intended that the appended claims be broadly construed to cover all such alternative embodiments, except as limited by the prior art.

What is claimed is:

1. An integrated circuit (IC) package comprising:
    a lead frame including a die attach pad and a plurality of leads;
    a first electrical component and a first die attached to the die attach pad and electrically connected to the leads;
    a first clip attached to the first die, the first clip electrically connected to the leads;
    a second die electrically connected to the first clip and the first electrical component, the second die attached to the first clip; and
    a second clip attached to the second die, wherein the second clip does not have tie bars, and wherein the second clip includes a singulation mark.

2. The IC package of claim 1 further comprising mold compound covering portions of the lead frame, the die attach pad, the plurality of leads, the first electrical component, the first die, the first clip, the second die, and the second clip.

3. The IC package of claim 1, wherein the first clip includes a plurality of tie bars that mechanically connect the first clip to a frame portion of the lead frame.

4. The IC package of claim 1, wherein the first clip includes two tie bars on one side and one tie bar on an opposite side.

5. The IC package of claim 1, wherein the first electrical component and the first die are electrically connected to the leads via bond wires.

6. The IC package of claim 1, wherein the IC package is a quad flat no-lead (QFN) package.

7. The IC package of claim 6, wherein the QFN package does not include tie bars that are exposed at a surface of the QFN package.

8. The IC package of claim 1, wherein the second clip is a gang clip that was singulated prior to attachment to the second die.

9. The IC package of claim 1, wherein the first clip is a gang clip.

10. An integrated circuit (IC) package comprising:
    a lead frame including a die attach pad and a plurality of leads;
    a first die attached to the die attach pad and electrically connected to the leads;
    a first clip attached to the first die, the first clip electrically connected to the leads;
    a second die electrically connected to the first clip and the first die, the second die attached to the first clip;
    a second clip attached to the second die, wherein the second clip does not have tie bars, and wherein the second clip includes a singulation mark; and mold compound covering portions of the lead frame, the die attach pad, the plurality of leads, the first die, the first clip, the second die, and the second clip.

11. The IC package of claim 10, wherein the first clip includes a plurality of tie bars that mechanically connect the first clip to a frame portion of the lead frame.

12. The IC package of claim 10, wherein the first clip includes two tie bars on one side and one tie bar on an opposite side.

13. The IC package of claim 10, wherein the first electrical component and the first die are electrically connected to the leads via bond wires.

14. The IC package of claim 10, wherein the IC package is a quad flat no-lead (QFN) package.

15. The IC package of claim 14, wherein the QFN package does not include tie bars that are exposed at a surface of the QFN package.

16. The IC package of claim 10, wherein the second clip is a gang clip that was singulated prior to attachment to the second die.

17. The IC package of claim 10, wherein the first clip is a gang clip.

18. An integrated circuit (IC) package comprising:
a lead frame including a die attach pad and a plurality of leads;
a first electrical component and a first die attached to the die attach pad and electrically connected to the leads;
a first clip attached to the first die, the first clip electrically connected to the leads;
a second die electrically connected to the first clip and the first electrical component, the second die attached to the first clip; and
a second clip attached to the second die, wherein the second clip does not have tie bars, and wherein the second clip is a gang clip that was singulated prior to attachment to the second die.

* * * * *